United States Patent
Scharf et al.

(10) Patent No.: US 10,366,924 B2
(45) Date of Patent: Jul. 30, 2019

(54) CHIP CARRIERS AND SEMICONDUCTOR DEVICES INCLUDING REDISTRIBUTION STRUCTURES WITH IMPROVED THERMAL AND ELECTRICAL PERFORMANCE

(71) Applicant: Infineon Technologies AG, Neubiberg (DE)

(72) Inventors: Thorsten Scharf, Regensburg (DE); Steffen Jordan, Viehhausen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/590,520

(22) Filed: May 9, 2017

(65) Prior Publication Data

US 2017/0345714 A1  Nov. 30, 2017

(30) Foreign Application Priority Data

May 30, 2016  (DE) .................. 10 2016 109 853

(51) Int. Cl.
  *H01L 21/78*  (2006.01)
  *H01L 23/00*  (2006.01)
  (Continued)

(52) U.S. Cl.
  CPC ............ *H01L 21/78* (2013.01); *H01L 23/373* (2013.01); *H01L 23/492* (2013.01); *H01L 23/49811* (2013.01); *H01L 23/49816* (2013.01); *H01L 23/49844* (2013.01); *H01L 23/5384* (2013.01); *H01L 23/5386* (2013.01); *H01L 23/5389* (2013.01); *H01L 24/03* (2013.01); *H01L 24/06* (2013.01); *H01L 24/19* (2013.01);
  (Continued)

(58) Field of Classification Search
  CPC ......... H01L 21/78; H01L 24/20; H01L 24/19; H01L 23/5389; H01L 23/5386; H01L 23/5384; H01L 23/492; H01L 24/03; H01L 25/0655; H01L 23/49811; H01L 24/36; H01L 24/06; H01L 23/49844; H01L 23/49816; H01L 23/373; H01L 24/48; H01L 2924/00014; H01L 2224/48091; H01L 2924/181; H01L 2224/04105; H01L 23/34; H01L 2224/73267; H01L 2224/12105; H01L 2224/24137; H01L 2224/32245; H01L 2924/15311

See application file for complete search history.

(56) References Cited

U.S. PATENT DOCUMENTS 8,003,515 B2  8/2011  Meyer et al.
8,138,587 B2  3/2012  Otremba
(Continued)

FOREIGN PATENT DOCUMENTS

DE  10 2007 039 536  2/2009

*Primary Examiner* — Edward Chin
(74) *Attorney, Agent, or Firm* — Dicke, Billig & Czaja, PLLC

(57) ABSTRACT

A chip carrier includes a redistribution structure, wherein the redistribution structure includes: a dielectric layer extending in a horizontal direction; a first electrically conductive layer arranged over the dielectric layer and extending in the horizontal direction; a trench arranged in the dielectric layer and extending in the horizontal direction; and a filling material filling the trench, wherein the filling material is different from the material of the dielectric layer.

21 Claims, 7 Drawing Sheets

(51) Int. Cl.
  *H01L 23/373* (2006.01)
  *H01L 23/492* (2006.01)
  *H01L 23/498* (2006.01)
  *H01L 23/538* (2006.01)
  *H01L 25/065* (2006.01)
  *H01L 23/34* (2006.01)

(52) U.S. Cl.
  CPC ............. *H01L 24/20* (2013.01); *H01L 24/36* (2013.01); *H01L 25/0655* (2013.01); *H01L 23/34* (2013.01); *H01L 24/48* (2013.01); *H01L 2224/04105* (2013.01); *H01L 2224/12105* (2013.01); *H01L 2224/24137* (2013.01); *H01L 2224/32245* (2013.01); *H01L 2224/48091* (2013.01); *H01L 2224/73267* (2013.01); *H01L 2924/00014* (2013.01); *H01L 2924/15311* (2013.01); *H01L 2924/181* (2013.01)

(56) References Cited

U.S. PATENT DOCUMENTS

| | | | | |
|---|---|---|---|---|
| 8,507,320 B2 * | 8/2013 | Otremba | ................ | H01L 23/36 257/33 |
| 8,698,298 B2 * | 4/2014 | Henrik | ................ | H01L 21/56 257/686 |
| 9,196,402 B2 | 11/2015 | Feichtinger et al. | | |
| 2003/0222340 A1 * | 12/2003 | Kondo | ................ | H01L 23/498 257/700 |
| 2009/0029521 A1 * | 1/2009 | Sheen | ............... | H01L 21/76224 438/424 |

\* cited by examiner

CHIP CARRIERS AND SEMICONDUCTOR DEVICES INCLUDING REDISTRIBUTION STRUCTURES WITH IMPROVED THERMAL AND ELECTRICAL PERFORMANCE

CROSS-REFERENCE TO RELATED APPLICATION

This Utility Patent Application claims priority to German Patent Application No. 10 2016 109 853.1, filed May 30, 2016 which is incorporated herein by reference.

BACKGROUND

The present disclosure relates in general to chip carriers and semiconductor devices. More particular, the disclosure relates to chip carriers and semiconductor devices including redistribution structures with improved thermal and electrical performance. Electronic devices may include structures configured to provide a routing and redistribution of electrical currents. The design and dimensions of components forming such redistribution structures may depend on the strength of the electric currents occurring during an operation of the electronic devices. Manufacturers of electronic devices seek to provide solutions with improved thermal and electrical performance.

SUMMARY

Various aspects pertain to a chip carrier including a redistribution structure, wherein the redistribution structure includes: a dielectric layer extending in a horizontal direction; an electrically conductive layer arranged over the dielectric layer and extending in the horizontal direction; a trench arranged in the dielectric layer and extending in the horizontal direction; and a filling material filling the trench, wherein the filling material is different from the material of the dielectric layer.

Various aspects pertain to a semiconductor device including: a material layer; a semiconductor chip embedded in the material layer; and a redistribution structure electrically coupled to the semiconductor chip. The redistribution structure includes: a dielectric layer extending in a horizontal direction; an electrically conductive layer arranged over the dielectric layer and extending in the horizontal direction; a trench arranged in the dielectric layer and extending in the horizontal direction; and a filling material filling the trench, wherein the filling material is different from the material of the dielectric layer.

Various aspects pertain to a method for fabricating a redistribution structure, wherein the method includes the following acts: forming a dielectric layer, wherein the dielectric layer extends in a horizontal direction; forming a trench in the dielectric layer, wherein the trench extends in the horizontal direction; filling the trench with a filling material different from the material of the dielectric layer; and forming an electrically conductive layer over the dielectric layer.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

Figure 1:
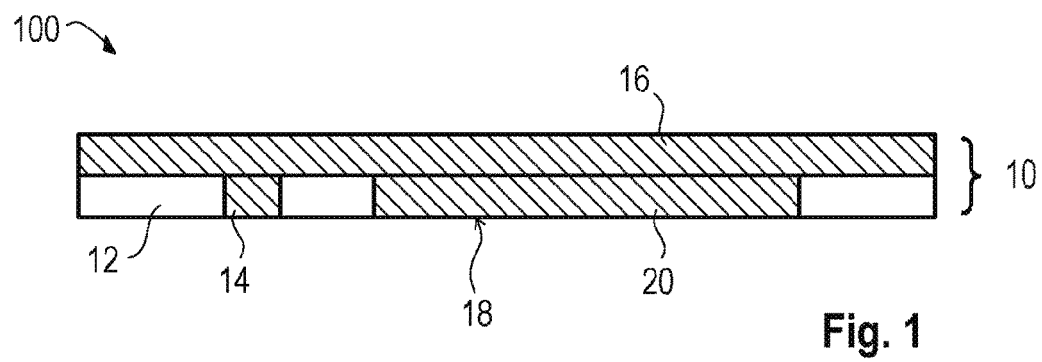
FIG. 1 schematically illustrates a cross-sectional side view of a chip carrier 100 in accordance with the disclosure. The chip carrier includes a redistribution structure having a dielectric layer, an optional via connection and an electrically conductive layer. In addition, a filled trench is arranged in the dielectric layer.

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

The devices described herein may include or may correspond to a chip carrier. For example, a chip carrier may be included in a semiconductor device such as e.g. a flip-chip device or a BGA (Ball Grid Array) device. A chip carrier may be configured to provide a redistribution of electrical signals and electrical currents inside or through the chip carrier by means of a redistribution structure included in the chip carrier as described below. A chip carrier may serve as a carrier on which one or more electronic components may be mounted. In this regard, the chip carrier may provide a stable platform having a coefficient of thermal expansion (CTE) that may be close to the CTE of mounted components in order to avoid mechanical stress caused by CTE mismatches. A chip carrier may provide an electrical and/or thermal connection of mounted components to e.g. a printed circuit board (PCB).

The devices described herein may include one or more semiconductor chips. The semiconductor chips may be of different types and may be manufactured by different technologies. In general, the semiconductor chips may include integrated circuits, passive electronic components, active electronic components, etc. The integrated circuits may be designed as logic integrated circuits, analog integrated circuits, mixed signal integrated circuits, power integrated circuits, etc. The semiconductor chips need not be manufactured from a specific semiconductor material and may contain inorganic and/or organic materials that are not semiconductors, such as, for example, insulators, plastics, metals, etc. In one example, the semiconductor chips may be manufactured from an elemental semiconductor material, for example Si, etc. In a further example, the semiconductor chips may be manufactured from a compound semiconductor material, for example GaN, SiC, SiGe, GaAs, etc.

The devices described herein may include a redistribution structure. For example, the redistribution structure may be included in a chip carrier or a semiconductor device. Various applications of redistribution structures in accordance with the disclosure are provided below.

The redistribution structure may include one or multiple electrically conductive layers. In particular, the electrically conductive layers may be planar and may extend in a horizontal direction. The electrically conductive layers may be employed as wiring layers and configured to provide an electrical and/or thermal interconnection between electronic components of the device. In one example, the wiring layers may provide an interconnection between a semiconductor chip mounted on a chip carrier that includes the redistribution structure and a PCB coupled to the chip carrier. In a further example, the wiring layers may provide an interconnection between semiconductor chips of a semiconductor device that includes the redistribution structure. The electrically conductive layers may thus be configured to make I/O pads of electronic components (e.g. semiconductor chips) of a device available in other locations of the device.

The electrically conductive layers of the redistribution structure may be manufactured with any desired geometric shape and/or any desired material composition. For example, the electrically conductive layers may be structured and may have a shape of conductor lines (or conductor tracks), but may also be in the form of a layer covering an area. In particular, the electrically conductive layers may be metallization layers. Any suitable metal, for example at least one of aluminum, nickel, palladium, titanium, titanium tungsten, silver, tin, gold, molybdenum, vanadium or copper, or associated metal alloys may be used for manufacturing the metallization layers.

The redistribution structure may include one or multiple dielectric layers. In particular, the dielectric layers may be planar and may extend in a horizontal direction. The dielectric layers may be particularly arranged between the electrically conductive layers and configured to electrically insulate the electrically conductive layers from each another. The dielectric layers may include or may be made of at least one of a polymer, a polyimide, an epoxy resin, a silicone, a laminate, etc.

The redistribution structure may include one or multiple via connections (or through hole connections) that may be configured to electrically couple electrically conductive layers arranged on different levels, thus providing an electrical interconnection between different electrically conductive layers. In particular, the via connections may extend through the horizontal dielectric layers in a vertical direction. That is, the via connections may particularly extend in a direction substantially perpendicular to the electrically conductive layers. For example, the via connections and the electrically conductive layers of the redistribution structure may be manufactured from a similar material.

The redistribution structure may include one or multiple trenches arranged in the dielectric layers and extending in the horizontal direction. In one example, a trench may vertically extend through an entire dielectric layer, i.e. from the lower horizontal surface of the dielectric layer to the upper horizontal surface of the dielectric layer. In a further example, a trench may only partly extend into the respective dielectric layer. The depth of a trench may be constant or may vary over its extent. The trenches may be manufactured with any desired geometric shape depending on the considered application.

The redistribution structure may include a filling material that may at least partly fill the trench(es). In one example, the filled trenches may have a shape of lines (or tracks). In further examples, the filled trenches may have the form of stripes, ribbons, rectangles, etc. A filled trench may be in direct contact with the adjacent electrically conductive layer(s) or not. The filling material may particularly differ from the material of the dielectric layers.

The filling material may be electrically conductive and may be in contact with one or more of the electrically conductive layers of the redistribution structure. The filled trench may thus be electrically coupled to the electrically conductive layer, wherein the filled trench may form an electrically conductive line. That is, the filled trench may support or fortify a conduction of electrical currents through the electrically conductive layers. An electrically conductive filling material may e.g. include at least one of carbon, copper, gold, nickel, tin, aluminum, alloys thereof, etc.

The filling material may be thermally conductive and may form a thermally conductive line. Here, the filled trench may be in contact with the electrically conductive layers of the redistribution structure or not. In one example, such thermally conductive line may be configured to thermally couple a first electronic component to at least one of a thermal sensor and a heat sink. In a further example, the thermally conductive line may be configured to route thermal energy around or away from an electronic component that may be heat sensitive. A thermally conductive filling material may include at least one of carbon, silicon nitride, boron nitride, aluminum oxide, aluminum nitride, etc.

The devices described herein may include a material layer that may at least partly embed one or more semiconductor chips of a device in accordance with the disclosure. The material layer may include at least one of a laminate, an epoxy, a filled epoxy, glass fiber filled epoxy, an imide, a thermoplast, a duroplast polymer, a polymer blend.

FIG. 1 schematically illustrates a cross-sectional side view of a chip carrier 100 in accordance with the disclosure. The chip carrier 100 is illustrated in a general manner in order to qualitatively specify aspects of the disclosure. The chip carrier 100 may include further components which are not illustrated for the sake of simplicity. For example, the chip carrier 100 may further include one or more components of other devices in accordance with the disclosure.

The chip carrier 100 may include a redistribution structure 10. The redistribution structure 10 may include a dielectric layer 12 that may extend in a horizontal direction. The redistribution structure 10 may further include an optional electrically conductive via connection 14 that may extend vertically through the dielectric layer 12. The redistribution structure 10 may further include an electrically conductive layer 16 arranged over the dielectric layer 12 and extending in the horizontal direction. The electrically conductive layer 16 may be electrically coupled to the optional via connection 14. The redistribution structure 10 may further include a trench 18 arranged in the dielectric layer 12 and extending in the horizontal direction. The redistribution structure 10 may further include a filling material 20 filling the trench 18, wherein the filling material 20 is different from the material of the dielectric layer 12.

In the example of FIG. 1, the filling material 20 is illustrated to be separate from the via connection 14. In further examples, the filling material 20 may also be in contact with the via connection 14. Further, it is to be noted that the redistribution structure 10 may be extended to include further dielectric layers, further via connections, further filled trenches and/or further electrically conductive layers of arbitrary numbers. Here, one or more of the dielectric layers may be arranged between adjacent electrically conductive layers. The via connections may extend through one or more of the dielectric layers in order to electrically couple electrically conductive layers arranged on different levels.

During an operation of electronic devices including a redistribution structure, electrical currents and signals may flow through via connections and electrically conductive layers of the redistribution structure. Here, the thickness of the electrically conductive layers may have to compromise between a desired low electrical resistance of the layers, which may be achieved by choosing an increased thickness of the layers, and desired low manufacturing costs and a high routing density of the layers, which may be achieved by choosing a reduced thickness of the layers. In general, the electrical resistance of the electrically conductive layers may limit the application field and the efficiency of applications to be implemented. In many applications, the thickness of the electrically conductive layers may need to be increased which may then result in poor design rules, i.e. wider layers and limited capabilities for logic routing, or higher costs by more complicated manufacturing processes (e.g. pattern plating) or even the necessity of additional layers for routing.

Redistribution structures in accordance with the disclosure may particularly include filled trenches 20 as described in connection with FIG. 1. If the filling material 20 filling the trenches 18 is electrically conductive, the filled trenches 20 may represent additional electrically conductive traces and may act as fortifications of current paths extending along the electrically conductive layers 16 of the redistribution structure 10. Due to the application of the filled trenches 20, the thickness of the electrically conductive layers 16 may not need to be increased in order to avoid the above described technical issues. In particular, redistribution structures in accordance with the disclosure may avoid an increased thickness of the electrically conductive layer 16 in logic areas of the chip carrier 100 where a high routing density may be required. Redistribution structures in accordance with the disclosure including filled trenches 20 may thus outperform conventional redistribution structures excluding the described filled trenches.

Furthermore, the filled trenches 20 may provide the possibility for routing thermal energy along a desired route. In other words, the filled trenches 20 may also act as a heat pipe. By enforcing the heat transport capacity into the direction along the filled trenches 20, thermal energy may be transferred from a heat source, such as e.g. a power semiconductor chip, to at least one of a heat sink and a thermal sensor. The application of a thermally conductive material filling the trenches 18 may thus reduce a thermal resistance and may be used to avoid temperature increases at heat sensitive areas in or on the chip carrier 100, for example at positions on the chip carrier 100 where sensors or high density semiconductor chips may be mounted. For example, the filled trenches 20 providing an increased heat capacity may be applied in power semiconductor applications. For a desired routing of thermal energy via the filled trenches 20, the filling material may be both electrically conductive and thermally conductive, but may also exclusively provide a thermal conductivity.

Figure 2:
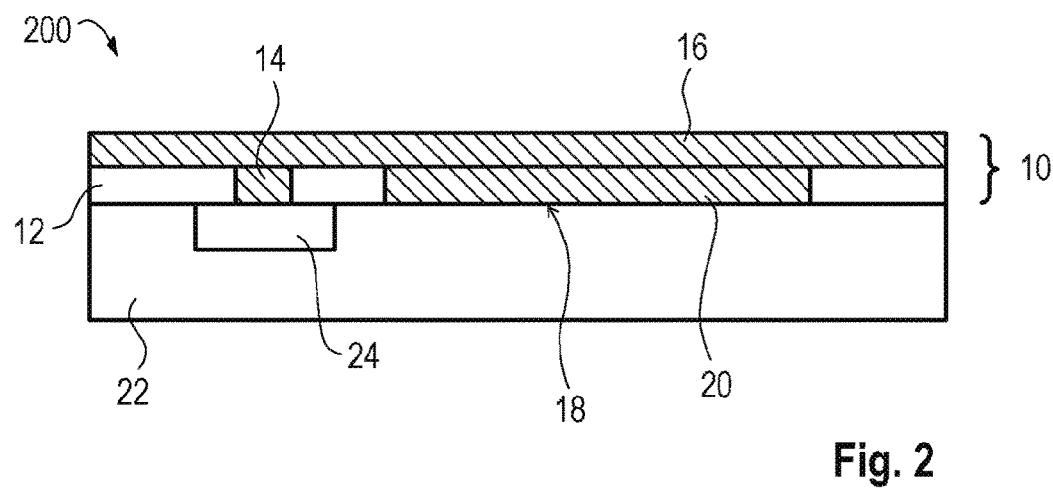
FIG. 2 schematically illustrates a cross-sectional side view of a semiconductor device in accordance with the disclosure. The semiconductor device includes a material layer, a semiconductor chip embedded therein and a redistribution structure similar to FIG. 1.

FIG. 2 schematically illustrates a cross-sectional side view of a semiconductor device 200 in accordance with the disclosure. The semiconductor device 200 is illustrated in a general manner in order to qualitatively specify aspects of the disclosure. The semiconductor device 200 may include further components which are not illustrated for the sake of simplicity. For example, the semiconductor device 200 may further include one or more components of other devices in accordance with the disclosure.

The semiconductor device 200 may include a material layer 22 and a semiconductor chip 24 embedded in the material layer 22. The semiconductor device 200 may further include a redistribution structure 10 which may be similar to the redistribution structure 10 of FIG. 1, thus providing similar technical features. The redistribution structure 10 may be electrically coupled to the semiconductor chip 24. The redistribution structure 10 may include a dielectric layer 12 extending in a horizontal direction. The redistribution structure 10 may further include an optional electrically conductive via connection 14 extending vertically through the dielectric layer 12. The redistribution structure 10 may further include an electrically conductive layer 16 arranged over the dielectric layer 12 and extending in the horizontal direction. The electrically conductive layer 16 may be electrically coupled to the optional via connection 14. The redistribution structure 10 may further include a trench 18 arranged in the dielectric layer 12 and extending in the horizontal direction. A filling material 20 may fill the trench 18, wherein the filling material 20 is different from the material of the dielectric layer 12.

Figure 3A:
FIG. 3 includes FIGS. 3A to 3F schematically illustrating a cross-sectional side view of a method for manufacturing a redistribution structure in accordance with the disclosure. The manufactured redistribution structure may be similar to FIGS. 1 and 2.
Figure 3B:
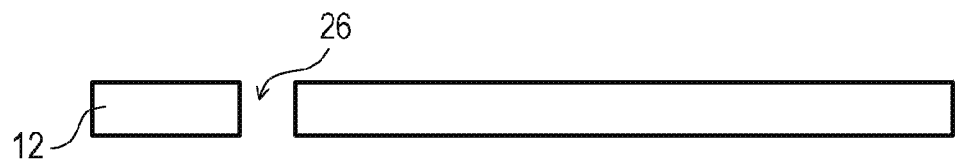
Figure 3C:
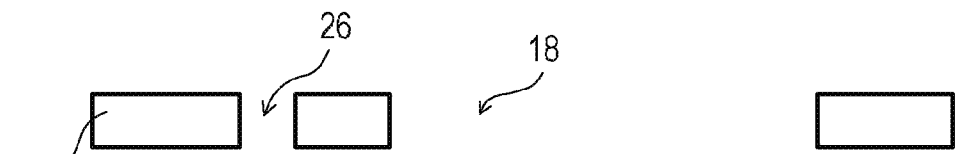
Figure 3D:
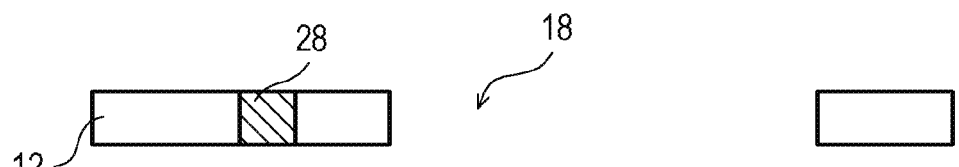
Figure 3E:
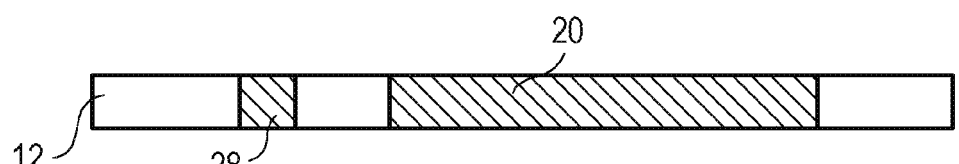
Figure 3F:
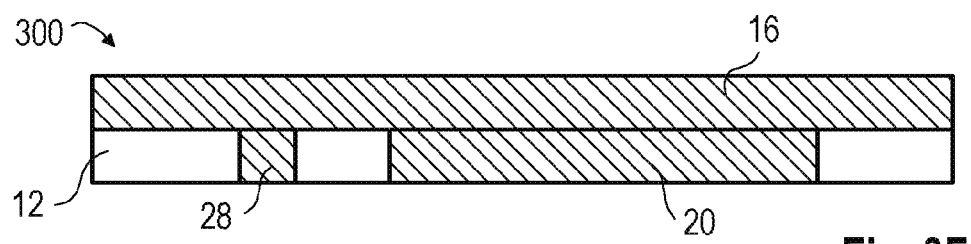

FIG. 3 includes FIGS. 3A to 3F schematically illustrating a cross-sectional side view of a method for manufacturing a redistribution structure 300 in accordance with the disclosure, a cross section of which is shown in FIG. 3F. The manufactured redistribution structure 300 may be similar to the redistribution structures described in connection with FIGS. 1 and 2.

In FIG. 3A, a dielectric layer 12 may be formed, wherein the dielectric layer 12 may extend in a horizontal direction. In particular, the upper and lower surface of the formed dielectric layer 12 may be substantially planar. In one example, the dielectric layer 12 may be deposited over a semiconductor chip and/or a material layer as e.g. shown in FIG. 2. In a further example, the dielectric layer 12 may be deposited over a surface of a temporary carrier that may be removed later on. The dielectric layer 12 may be manufactured in various ways. For example, the dielectric layer 12 may be deposited from a gas phase or from a solution or it may be laminated onto a surface. In addition or alternatively, a thin-film technology may be used for an application of the dielectric layer 12. The dielectric layer 12 may be manufactured from a polymer, e.g. polynorbornene, polyimide, parylene, photoresist material, imide, epoxy, duroplast, silicone or an inorganic, ceramic-like material, such as silicone-carbon compounds, silicon nitride, silicon oxide.

The (vertical) thickness of the dielectric layer 12 may depend on the application of the redistribution structure to be manufactured. In general, the thickness may lie in a range from about 2 micrometer to about 250 micrometer. For the case of a redistribution structure providing a routing of logical signals, the thickness may lie in a range from about 2 micrometer to about 50 micrometer. For the case of a redistribution structure providing a redistribution of power currents, the thickness may lie in a range from about 20 micrometers to about 250 micrometers. In particular, the thickness of the dielectric layer 12 may be substantially constant.

In FIG. 3B, a via (or microvia) hole 26 may be optionally formed in the dielectric layer 12, wherein the optional via hole 26 may extend vertically through the dielectric layer 12. Forming the via hole 26 may include at least one of: drilling, in particular laser drilling; etching, in particular plasma etching; photo lithography; nibbling; routing.

In FIG. 3C, a trench 18 may be formed in the dielectric layer 12, wherein the trench 18 may extend in the horizontal direction. In particular, the via hole 26 and the trench 18 may be formed by using a similar forming process. In one example, the via hole 26 and the trench 18 may be formed successively. In a further example, the via hole 26 and the trench 18 may be formed simultaneously. In the example of FIG. 3C, the trench 18 may extend through the entire thickness of the dielectric layer 12. In further examples, the trench 18 may only partly extend into the dielectric layer 12 such that the thickness of the dielectric layer 12 may be reduced. The depth of the trench 18 may be constant or may vary over the extent of the trench 18.

In FIG. 3D, the optional via hole 26 may be optionally filled with an electrically conductive material 28 such that the filled via hole 26 may be configured to conduct electrical currents in a vertical direction. The electrically conductive material 28 may include at least one of copper, aluminum, nickel, palladium, titanium, titanium tungsten, silver, tin, gold, molybdenum, vanadium, and alloys of the named metals.

In FIG. 3E, the trench 18 may be filled with a filling material 20 that may particularly be different from the material of the dielectric layer 12. The trench 18 may be filled in various ways. In particular, filling the trench 18 may include at least one of galvanic plating, direct plating, conformal plating, super conformal plating, lithographic structuring, a dual damascene process, filling and curing at least one of a solder paste, a sintering paste, an electrically conductive glue or combinations thereof. Note that filling the via hole 26 (see FIG. 3D) may be based on a similar process and may be performed at the same time.

In one example, the filling material 20 may be electrically conductive and thus may be configured to provide a conduction of electrical currents in the horizontal direction. A suitable electrically conductive filling material may e.g. include at least one of carbon, copper, gold, nickel, tin, aluminum, alloys thereof, etc. In a further example, the filling material 20 may be thermally conductive and thus may be configured to provide a conduction of thermal energy in the horizontal direction. A suitable thermally conductive filling material may include one of the above mentioned electrically conductive materials and/or at least one of carbon, silicon nitride, boron nitride, aluminum oxide, aluminum nitride, etc.

In FIG. 3F, an electrically conductive layer 16 may be formed over the dielectric layer 12, wherein the electrically conductive layer 16 may extend in the horizontal direction and may be electrically coupled to the optional filled via hole 28. Forming the electrically conductive layer 16 and/or filling the via hole 26 (see FIG. 3D) and/or filling the trench 18 (see FIG. 3E) may be based on a similar process. In particular, the electrically conductive layer 16 may be a deposited metallization layer, wherein the upper and lower surface of the metallization layer may be substantially planar. The electrically conductive layer 16 may be structured and may have the shape of conductor lines (or conductor tracks), but may also have the form of a layer covering an area with an arbitrary shape depending on the considered application. Any suitable metal, for example at least one of aluminum, nickel, palladium, titanium, titanium tungsten, silver, tin, gold, molybdenum, vanadium or copper, or associated metal alloys may be used for manufacturing the metallization layer 16.

The (vertical) thickness of the electrically conductive layer 16 may depend on the application of the redistribution structure to be manufactured. In general, the thickness may lie in a range from about 5 micrometer to about 50 micrometer. For the case of a redistribution structure providing a routing of logical signals, the thickness may lie in a range from about 5 micrometer to about 10 micrometer. For the case of a redistribution structure providing a redistribution of power currents, the thickness may lie in a range from about 20 micrometer to about 50 micrometer. However, it is to be noted that the redistribution structure may also be applied in applications in which electrical current peaks of up to 200 A or even more may occur. Here, the thickness of the electrically conductive layer 16 may require values from about 200 micrometer to even about 2000 micrometer. In particular, the thickness of the electrically conductive layer 16 may be substantially constant.

In the example of FIG. 3, the acts of filling the via hole 26 (see FIG. 3D), filling the trench 18 (see FIG. 3E) and forming the electrically conductive layer 16 (see FIG. 3F) are illustrated in separate figures. Exemplary processes for performing these acts have been specified above. It is to be noted that at least two of these three acts may be performed using a similar process. In addition, at least two of the acts may be performed successively or simultaneously. Furthermore, the material 28 filling the via hole 26, the material 20 filling the trench 18 and the material of the electrically conductive layer 16 may be similar.

The method of FIG. 3 illustrates a fabrication of an exemplary and non-limiting redistribution layer 300. The method is illustrated in a general manner in order to qualitatively specify aspects of the disclosure. It is understood that the method of FIG. 3 may be extended to the fabrication of a redistribution layer including multiple dielectric layers, multiple via connections, multiple filled trenches and/or multiple electrically conductive layers of arbitrary numbers. Furthermore, the method of FIG. 3 may be extended by additional acts and features. For example, the dielectric layer 12 in FIG. 3A may be provided with an additional conductor foil on one or both of its main surfaces. The via hole 26 and the trench 18 may then also be formed and filled therein. During the filling process the previously provided conductor foil may be thickened.

Figure 4:
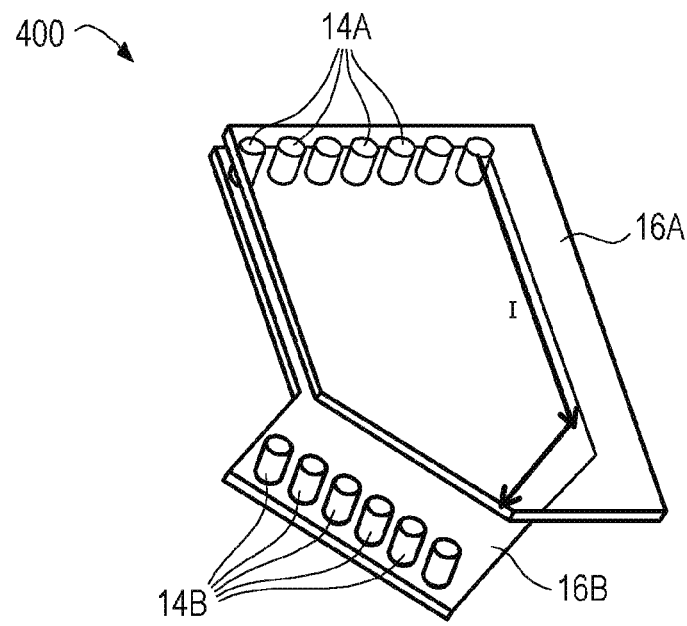
FIG. 4 schematically illustrates a perspective view of a detail of a redistribution structure including electrically conductive layers, a dielectric layer arranged in between and via connections.

FIG. 4 schematically illustrates a perspective view of a detail of a redistribution structure 400. The redistribution layer 400 may include a first electrically conductive layer 16A arranged on a first (upper) level and a second electrically conductive layer 16B arranged on a second (lower) level. The electrically conductive layers 16A, 16B may be substantially parallel to each other and may extend in a horizontal direction. The redistribution structure 400 may further include a first plurality of substantially vertical electrically conductive via connections 14A and a second plurality of substantially vertical electrically conductive via connections 14B configured to electrically couple the electrically conductive layers 16A, 16B. The number of via connections may be arbitrary. The redistribution structure 400 may further include a dielectric layer arranged between the electrically conductive layers 16A, 16B which is not illustrated in the example of FIG. 4 for illustrative reasons.

In the example of FIG. 4, the via connections 14A, 14B of a respective plurality may be arranged in a side by side equidistant manner on a fictive straight line. In further examples, the distances between the via connections 14A, 14B may vary and the positions of the via connections 14A, 14B may deviate from the fictive straight line. Furthermore, in the example of FIG. 4, the electrically conductive layers 16A, 16B may be planar layers covering extended areas. In a further example, each of the electrically conductive layers 16A, 16B may include multiple conductive lines (or tracks), each one extending from one via connection of the first plurality of via connections 14A to one via connection of the second plurality of via connections 14B.

During an operation of a device including the redistribution structure 400, electrical currents may flow in the electrically conductive layers 16A, 16B in the horizontal direction. In the example of FIG. 4, an exemplary direction of such electrical current "I" is indicated by an arrow. Since the electrically conductive layers 16A, 16B may be electrically coupled by the via connections 14A, 14B, the layers 16A, 16B may be configured to conduct an electrical current in the same horizontal direction. By electrically coupling the layers 16A, 16B, an ampacity of the arrangement may thus be substantially doubled. A suitable number of via connections 14A, 14B electrically coupling the electrically conductive layers 16A, 16B may depend on the magnitude of the occurring electrical currents. In general, higher currents may require an increased number of via connections and electrically conductive layers 16A, 16B having an increased surface area. For example, a routing of logical signals may require a smaller number of via connections and a reduced surface area of the layers 16A, 16B compared to a distribution of power application currents. In further examples, the size and the form of the via connections may be chosen depending on the magnitude of the occurring electrical currents.

Figure 5:
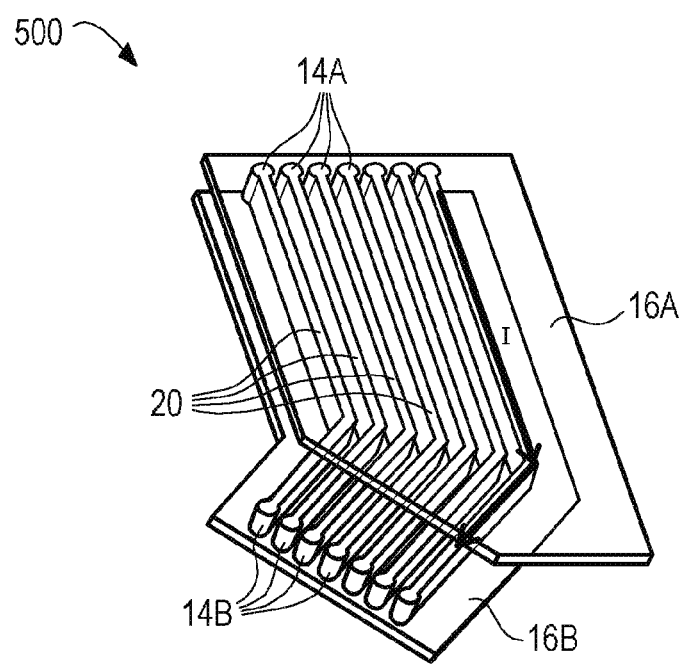
FIG. 5 schematically illustrates a perspective view of a detail of a redistribution structure in accordance with the disclosure similar to FIG. 4. In addition, filled trenches are arranged in the dielectric layer.

FIG. 5 schematically illustrates a perspective view of a detail of a redistribution structure 500 in accordance with the disclosure. The redistribution structure 500 may be seen as a more detailed implementation of the redistribution structures shown in FIGS. 1 to 3.

The redistribution structure 500 may include electrically conductive layers 16A, 16B and a dielectric layer (not illustrated) arranged in between. The redistribution structure 500 may further include a first plurality of substantially vertical electrically conductive via connections 14A and a second plurality of substantially vertical electrically conductive via connections 14B configured to electrically couple the electrically conductive layers 16A, 16B. The named components may be similar to corresponding components of the redistribution structure 400 of FIG. 4. In contrast to FIG. 4, the redistribution structure 500 of FIG. 5 may additionally include a plurality of filled trenches 20 arranged in the dielectric layer. Each of the filled trenches 20 may extend between two via connections of the different pluralities of via connections 14A, 14B. In the example of FIG. 5, the filled trenches 20 are illustrated to have a thickness smaller than a thickness of the via connections 14A, 14B. In further examples, the thickness of the filled trenches 20 may equal or may be larger than the thickness of the via connections 14A, 14B. It is noted that in yet further examples the redistribution structure 500 may not necessarily include the via connections 14A, 14B such that in a corresponding figure the via connections 14A, 14B located at the ends of the filled trenches 20 may be omitted.

In the example of FIG. 5, the filled trenches 20 may entirely extend through the dielectric layer (not illustrated) and may be in contact with each of the electrically conductive layers 16A, 16B. In a further example, the filled trenches 20 may not fully extend through the dielectric layer and thus may be in contact with only one of the electrically conductive layers 16A, 16B. In yet a further example, the filled trenches 20 may be in contact with at least one of the electrically conductive layers 16A, 16B, but may be separated from the via connections 14A, 14B.

Figure 6:
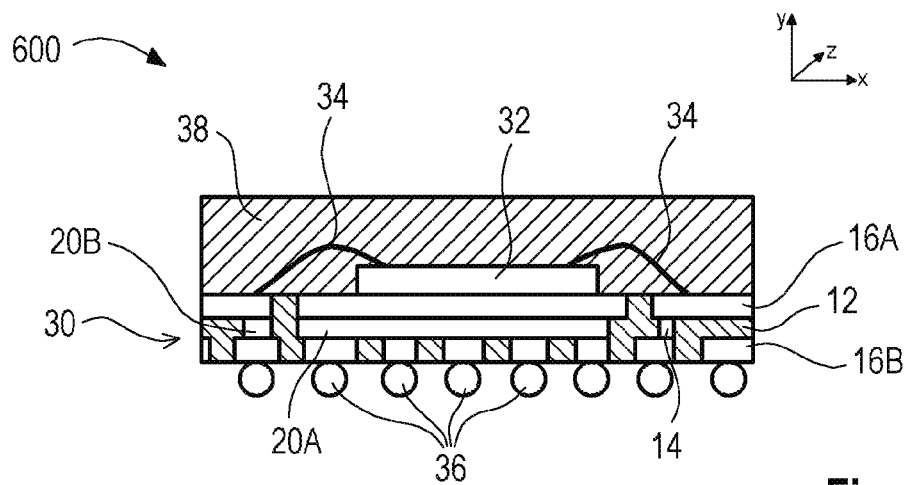
FIG. 6 schematically illustrates a cross-sectional side view of an electronic device including a chip carrier in accordance with the disclosure.

FIG. 6 schematically illustrates a cross-sectional side view of an electronic device 600. The device 600 may correspond to a BGA device and may include a chip carrier 30 in accordance with the disclosure. A semiconductor chip 32 may be mounted over the upper main surface of the chip carrier 30 and may be electrically coupled to electrical contacts on the upper main surface of the chip carrier 30 via bond wires 34. The semiconductor chip 32 may be embedded in an encapsulation material 38 which may include at least one of a laminate, an epoxy, a filled epoxy, glass fiber filled epoxy, an imide, a thermoplast, a duroplast polymer, a polymer blend. The device 600 may further include external contact elements 36, such as e.g. solder deposits, that may be applied to electric contacts on the lower main surface of the chip carrier 30.

The chip carrier 30 may include a redistribution structure which may be configured to electrically couple the semiconductor chip 32 to the external contact elements 36. The redistribution structure may include a first electrically conductive layer 16A, a second electrically conductive layer 16B, a dielectric layer 12 arranged in between and via connections 14 electrically coupling the electrically conductive layers 16A, 16B. The semiconductor chip 32 may be electrically insulated from the first electrically conductive layer 16A, for example by a further dielectric layer (not illustrated) arranged in between.

The redistribution structure may include one or multiple filled trenches 20A, 20B arranged in the dielectric layer 12. In the example of FIG. 6, a first filled trench 20A may extend in the horizontal x-direction and may be electrically coupled to multiple of the external contact elements 36 via the second electrically conductive layer 16B. That is, in the example of FIG. 6, multiple of the external contact elements 36 may be on the same electrical potential. A second filled trench 20B may be similar to the first filled trench 20A, but may extend in the horizontal z-direction. It is understood that the redistribution structure of the device 600 may include an arbitrary number of further electrically conductive layers, dielectric layers, via connections and filled trenches.

Figure 7:
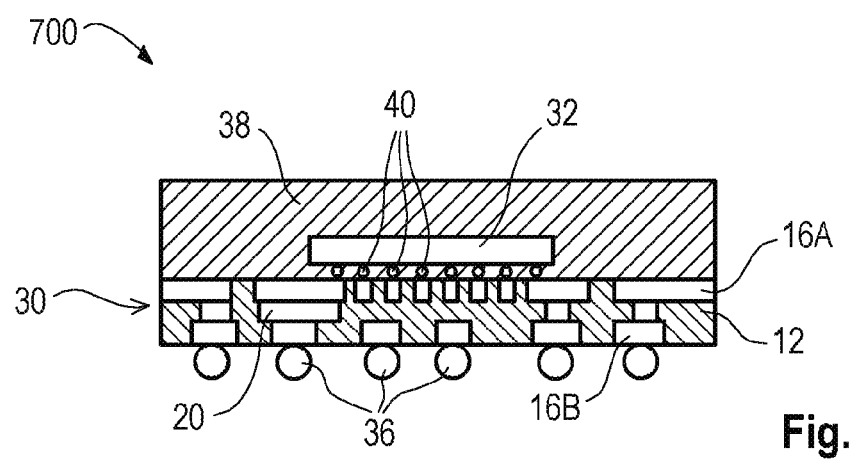
FIG. 7 schematically illustrates a cross-sectional side view of an electronic device including a chip carrier in accordance with the disclosure.

FIG. 7 schematically illustrates a cross-sectional side view of an electronic device 700. The device 700 may have been manufactured according to a flip-chip technology. The device 700 may be at least partly similar to the device 600 of FIG. 6 and may have similar components. The semiconductor chip 32 may be electrically coupled to the upper main surface of the chip carrier 30 via contact elements 40 (e.g. solder bumps, stud bumps, copper pillars) that may be arranged on the lower main surface of the semiconductor chip 32. Similar to FIG. 6, the chip carrier 30 may include a redistribution structure including filled trenches 20 and configured to electrically couple the semiconductor chip 32 to external contact elements 36 arranged over the lower surface of the chip carrier 30.

Figure 8:
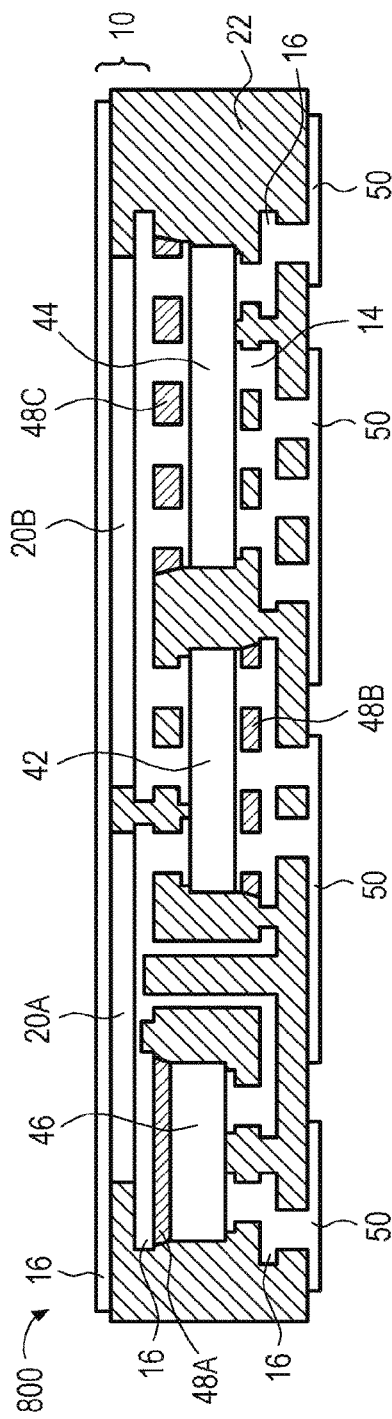
FIG. 8 schematically illustrates a cross-sectional side view of a semiconductor device including a semiconductor chip and a redistribution structure in accordance with the disclosure.

FIG. 8 schematically illustrates a cross-sectional side view of a semiconductor device 800 in accordance with the disclosure. The semiconductor device 800 is illustrated in a general manner in order to qualitatively specify aspects of the disclosure. The semiconductor device 800 may include further components which are not illustrated for the sake of simplicity.

The semiconductor device 800 may include a first power transistor 42, a second power transistor 44 and a logic semiconductor chip 46. The first power transistor 42 may have a vertical structure, i.e. it may be fabricated such that electrical currents may substantially flow in a direction perpendicular to the main surfaces of the semiconductor chip. A gate electrode and a source electrode may be arranged on the upper main surface of the first power transistor 42, and a drain electrode may be arranged on the opposite lower main surface of the first power transistor 42. The second power transistor 44 may be similar to the first power transistor 42, but arranged upside down. The logic semiconductor chip 46 may include multiple contact electrodes arranged over the lower main surface of the logic semiconductor chip 46.

The semiconductor chips 42, 44, 46 may be embedded in a material layer 22 that may include at least one of a laminate, an epoxy, a filled epoxy, glass fiber filled epoxy, an imide, a thermoplast, a duroplast polymer, a polymer blend. In addition, the semiconductor chips 42, 44, 46 may be electrically interconnected by multiple conductive layers 16 and multiple via connections 14 as illustrated in the example of FIG. 8. The electrically conductive layers 16 may be separated from each other by parts of the material layer 22. The upper main surface of the logic semiconductor chip 46, the lower main surface of the first power transistor 42 and the upper main surface of the second power transistor 44 may be attached to electrically insulating layers 48A, 48B, 48C, respectively. The drain contacts of the power transistors 42, 44 may be electrically accessible via electrically conductive material extending through the electrically insulating layers 48B, 48C, respectively.

The semiconductor chips 42, 44, 46 may be electrically interconnected to form a half bridge circuit. Here, the first power transistor 42 and the second power transistor 44 may correspond to a low side switch and a high side switch of the half bridge circuit, respectively. The logic semiconductor chip 46 may be configured to control and/or drive at least one of the first power transistor 42 and the second power transistor 44. In particular, the logic semiconductor chip 46 may include a driver circuit configured to drive the high side switch and the low side switch of the half bridge circuit. The semiconductor device 800 may further include external contact pads 50 arranged on the lower main surface of the semiconductor device 800 and providing electrical access to the semiconductor chips 42, 44, 46. In particular, the external contact pads 50 may be used for mounting and electrically coupling the semiconductor device 800 to a PCB (not illustrated).

The semiconductor device 800 may further include a redistribution structure 10 that may be electrically coupled to the semiconductor chips 42, 44, 46. The redistribution layer 10 may include filled trenches 20A, 20B arranged between electrically conductive layers 16, for example in the material layer 22. A first filled trench 20A may particularly include a thermally conductive material that may provide a thermal connection for heat conduction. For example, the first filled trench 20A may be configured to support a heat conduction to a sensor that may be included in the logic semiconductor chip 46. A second filled trench 20B may particularly include an electrically conductive material that may reduce an ohmic resistance of an electrical connection between the power transistors 42 and 44.

Figure 9:
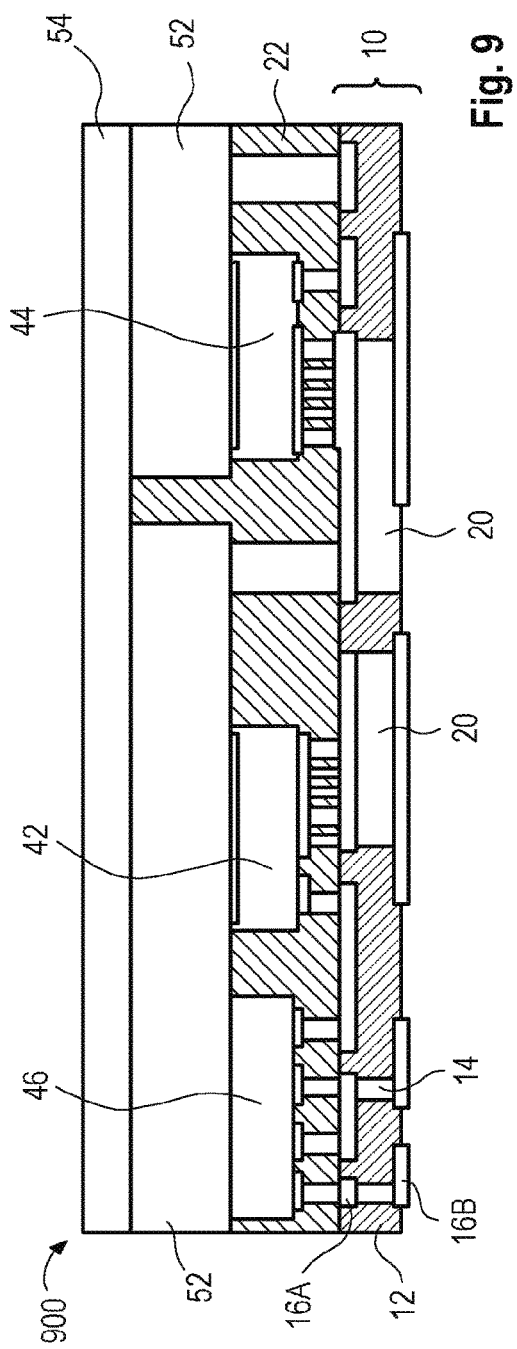
FIG. 9 schematically illustrates a cross-sectional side view of a semiconductor device including a semiconductor chip and a redistribution structure in accordance with the disclosure.

FIG. 9 schematically illustrates a cross-sectional side view of a semiconductor device 900 in accordance with the disclosure. The semiconductor device 900 is illustrated in a general manner in order to qualitatively specify aspects of the disclosure. The semiconductor device 900 may include further components which are not illustrated for the sake of simplicity.

The semiconductor device 900 may include a first power transistor 42, a second power transistor 44 and a logic semiconductor chip 46 embedded in a material layer 22. The components may be similar to like components of FIG. 8. The semiconductor chips 42, 44, 46 may be mounted on a lower main surface of a chip carrier, e.g. a leadframe 52. A dielectric layer 54 may be arranged on the upper main surface of the leadframe 52.

The semiconductor device 900 may include a redistribution structure 10 that may include a first electrically conductive layer 16A, a second electrically conductive layer 16B and a dielectric layer 12 arranged in between. The electrically conductive layers 16A, 16B may be electrically coupled by vertical via connections 14. The redistribution structure 10 may further include filled trenches 20 arranged in the dielectric layer 12 and electrically coupled to the electrically conductive layers 16A, 16B. The filled trenches 20 may include an electrically conductive material in order to increase an ampacity of the redistribution structure 10 in the horizontal direction. The redistribution structure 10 may be configured to electrically couple the semiconductor chips 42, 44, 46 to the second electrically conductive layer 16B. The second electrically conductive layer 16B may be exposed on the lower main surface of the semiconductor device 900 such that the exposed parts of the layer 16B may be used as external contact pads, in particular for mounting and electrically coupling the semiconductor device 900 to a PCB (not illustrated).

Figure 10:
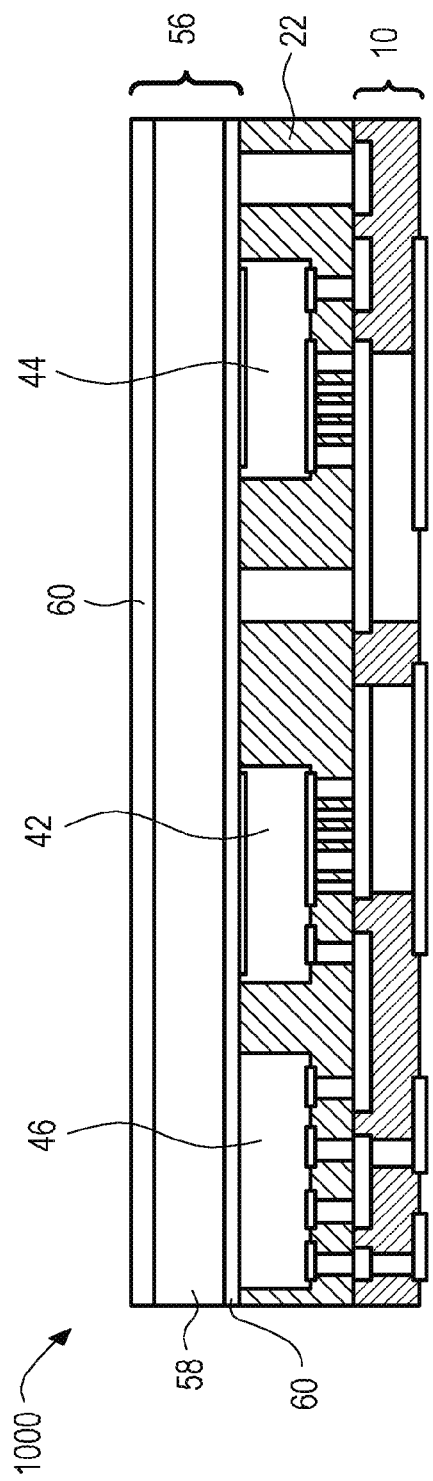
FIG. 10 schematically illustrates a cross-sectional side view of a semiconductor device including a semiconductor chip and a redistribution structure in accordance with the disclosure.

FIG. 10 schematically illustrates a cross-sectional side view of a semiconductor device 1000 in accordance with the disclosure. The semiconductor device 1000 may be at least partly similar to the semiconductor device 900 of FIG. 9 and may include similar components. In contrast to FIG. 9, the semiconductor chips 42, 44, 46 may not be mounted on a leadframe, but on a Direct Copper Bond (DCB) or Direct Bond Copper (DBC) substrate 56. The DCB substrate 56 may include a ceramic core 58 and layers of copper 60 arranged on one or both of the main surfaces of the ceramic core 58. For example, the ceramic material may include at least one of alumina ($Al_2O_3$), aluminum nitride (AlN), beryllium oxide (BeO), etc.

Figure 11:
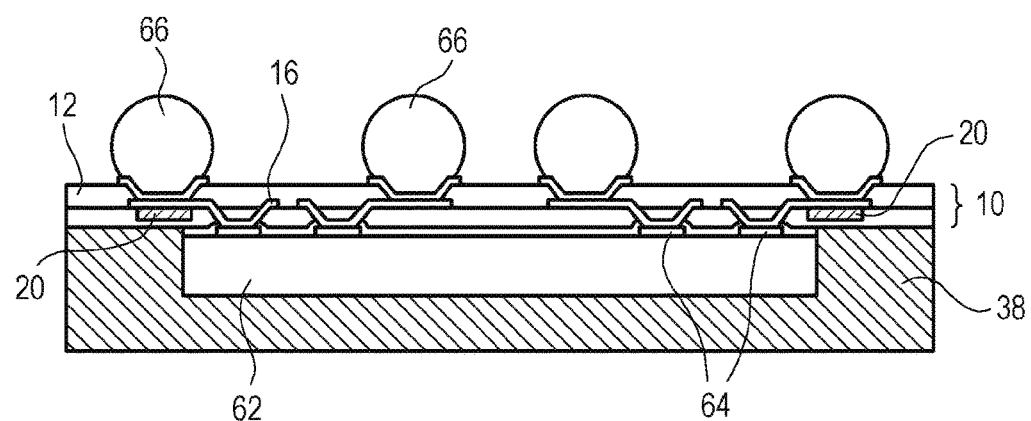
FIG. 11 schematically illustrates a cross-sectional side view of a semiconductor device including a semiconductor chip and a redistribution structure in accordance with the disclosure.

FIG. 11 schematically illustrates a cross-sectional side view of a semiconductor device 1100 in accordance with the disclosure. The semiconductor device 1100 may include a semiconductor chip 62 embedded in an encapsulation material 38 that may be similar to the encapsulation material 38 of FIG. 6. In particular, the upper main surface of the encapsulation material 38 and the upper main surface of the semiconductor chip 62 may be substantially coplanar. Contact elements 64 may be arranged on the upper main surface of the semiconductor chip 62. The contact elements 64 may provide electrical access to internal electronic structures of the semiconductor chip 62. The semiconductor device 1100 may further include a redistribution structure 10 arranged over the upper main surface of the semiconductor chip 62 and external contact elements 66, such as e.g. solder deposits, arranged over the redistribution structure 10. The semiconductor device 1100 may correspond to an embedded wafer level (eWLB) package or a fan-out wafer level package (FOWLP). Here, the term "fan-out" may indicate that one or more of the external contact elements 66 may be arranged outside of an outline of the semiconductor chip 62 when viewed in a direction perpendicular to the main surface of the semiconductor chip 62.

The redistribution structure 10 may be configured to electrically couple the contact elements 64 of the semiconductor chip 62 to the external contact elements 66. The redistribution structure 10 may include at least one dielectric layer 12 and at least one electrically conductive layer 16. In addition, the redistribution structure 10 may include at least one filled trench 20 arranged in the dielectric layer 12 and electrically coupled to the electrically conductive layer 16. The filled trench 20 may particularly include an electrically conductive material and may thus increase an ampacity of the redistribution structure 10 in the horizontal direction.

Figure 12:
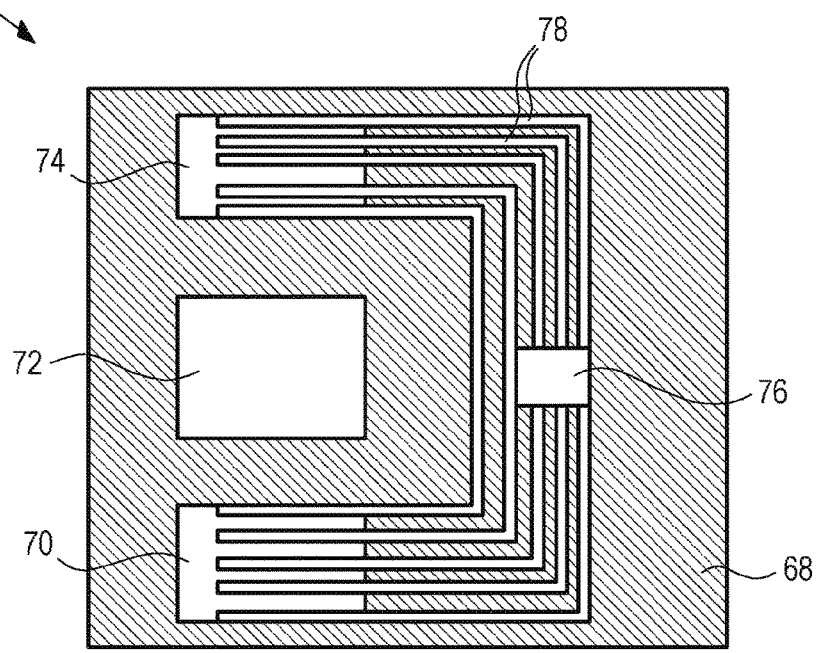
FIG. 12 schematically illustrates a top view of an electronic device including a redistribution structure in accordance with the disclosure.

FIG. 12 schematically illustrates a top view of an electronic device 1200 in accordance with the disclosure. The device 1200 may include a chip carrier 68. A first electronic component 70, a second electronic component 72, a heatsink 74 and a thermal sensor 76 may be arranged at the chip carrier 68. The first electronic component 70 may be configured to generate thermal energy during an operation of the electronic device 1200 and thus may be seen as a heat source. In this regard, the first electronic component 70 may be a power semiconductor chip in one example. The second electronic component 72 may be a heat sensitive device, i.e. an operation of the second electronic component 72 may be negatively influenced by high temperatures that may e.g. result from heat generated by the first electronic component 70.

The device 1200 may further include one or multiple thermally conductive lines 78. One or multiple of the thermally conductive lines 78 may extend from the first electronic component 70 to the thermal sensor 76 and from the thermal sensor 76 to the heatsink 74. The thermally conductive lines 78 may include or may correspond to trenches filled with a thermally conductive material as described in connection with foregoing examples. In this regard, it is to be noted that the thermally conductive lines 78 may be particularly arranged in the chip carrier 68, but not on an exposed surface of the chip carrier 68. That is, in the example of FIG. 12, the thermally conductive lines 78 are explicitly illustrated for illustrative purposes, but may not necessarily be visible in a real top view of the device 1200.

The thermally conductive lines 78 may be configured to thermally couple the first electronic component 70 to at least one of the thermal sensor 76 and the heat sink 74. In particular, the thermally conductive lines 78 may be arranged to bypass the second electronic component 72 such that thermal energy generated by the first electronic component 70 may be routed around or away from the heat sensitive second electronic component 74. During an operation of the device 1200, the temperature at the position of the second electronic component 72 may thus be reduced. It is noted that the device 1200 is exemplary and illustrates various technical features provided by the thermally conductive lines 78 as described above. In further examples, only one or selected ones of these technical features, but not all of them, may be realized.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features. The articles "a", "an" and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A chip carrier comprising a redistribution structure, the redistribution structure comprising:
    a dielectric layer extending in a horizontal direction;
    a first electrically conductive layer arranged over the dielectric layer and extending in the horizontal direction, wherein horizontal dimensions of the first electrically conductive layer are greater than vertical dimensions of the first electrically conductive layer;
    a trench arranged in the dielectric layer and extending in the horizontal direction, wherein horizontal dimensions of the trench are greater than vertical dimensions of the trench, and wherein the horizontal dimensions of the trench are different than the horizontal dimensions of the first electrically conductive layer;
    a filling material filling the trench, wherein the filling material is different from the material of the dielectric layer; and
    an electrically conductive via connection extending vertically through the dielectric layer, wherein the first electrically conductive layer is electrically coupled to the via connection.

2. The chip carrier of claim 1, wherein the filling material is electrically conductive and electrically coupled to the first electrically conductive layer, wherein the filled trench forms an electrically conductive line.

3. The chip carrier of claim 1, wherein the filling material comprises at least one of carbon, copper, gold, nickel, tin, aluminum, and alloys thereof.

4. The chip carrier of claim 1, wherein the filling material is thermally conductive and the filled trench forms a thermally conductive line.

5. The chip carrier of claim 4, wherein the filling material comprises at least one of silicon nitride, boron nitride, aluminum oxide, aluminum nitride.

6. The chip carrier of claim 1, wherein the filled trench is configured to thermally couple a first electronic component to at least one of a thermal sensor and a heat sink.

7. The chip carrier of claim 1, wherein the filled trench is configured to route thermal energy around or away from a second electronic component.

8. The chip carrier of claim 1, further comprising:
    a second electrically conductive layer extending in the horizontal direction and electrically coupled to the first electrically conductive layer,
    wherein the dielectric layer is arranged between the first electrically conductive layer and the second electrically conductive layer, and
    wherein the first electrically conductive layer and the second electrically conductive layer are configured to conduct electrical currents in a same horizontal direction.

9. The chip carrier of claim 1, further comprising:
    multiple parallel trenches arranged in the dielectric layer and extending in the horizontal direction, wherein each of the multiple trenches is filled with the filling material.

10. The chip carrier of claim 1, wherein the chip carrier comprises:
    a main surface configured to mount a semiconductor chip; and
    an opposite surface opposite to the main surface and configured to mount an electrical contact element, wherein the chip carrier is configured to electrically couple the semiconductor chip to the electrical contact element.

11. A semiconductor device including the chip carrier of claim 1, comprising:
    a material layer;
    a semiconductor chip embedded in the material layer; and
    the redistribution structure electrically coupled to the semiconductor chip, wherein the redistribution structure comprises:
    a dielectric layer extending in a horizontal direction;
    an electrically conductive layer arranged over the dielectric layer and extending in the horizontal direction;
    a trench arranged in the dielectric layer and extending in the horizontal direction; and
    a filling material filling the trench, wherein the filling material is different from the material of the dielectric layer.

12. The semiconductor device of claim 11, wherein the material layer embedding the semiconductor chip comprises at least one of a laminate, an epoxy, a filled epoxy, glass fiber filled epoxy, an imide, a thermoplast, a duroplast polymer, a polymer blend.

13. The semiconductor device of claim 11, wherein the filling material is electrically conductive and electrically coupled to the electrically conductive layer, wherein the filled trench forms an electrically conductive line.

14. The semiconductor device of claim 11, wherein the filling material is thermally conductive and the filled trench forms a thermally conductive line.

15. A method for manufacturing the chip carrier including the redistribution structure of claim 1, the method comprising:
    forming a dielectric layer, wherein the dielectric layer extends in a horizontal direction;

forming a trench in the dielectric layer, wherein the trench extends in the horizontal direction;

filling the trench with a filling material different from the material of the dielectric layer; and forming an electrically conductive layer over the dielectric layer.

16. The method of claim 15, further comprising:

forming a via hole in the dielectric layer, wherein the via hole extends vertically through the dielectric layer; and filling the via hole with an electrically conductive material, wherein the electrically conductive layer is electrically coupled to the filled via hole.

17. The method of claim 15, wherein the filling material is at least one of thermally conductive and electrically conductive.

18. The method of claim 16, wherein the via hole and the trench are formed using the same forming process.

19. The method of claim 16, wherein at least two of the acts of filling the via hole, filling the trench and forming the electrically conductive layer is based on the same process.

20. The method of claim 15, wherein forming the trenches comprises at least one of laser drilling, plasma etching, photo lithography, nibbling, routing.

21. The method of claim 15, wherein filling the trenches comprises at least one of galvanic plating, direct plating, conformal plating, super conformal plating, lithographic structuring, a dual damascene process, filling and curing at least one of a solder paste, a sintering paste, an electrically conductive glue or combinations thereof.

* * * * *